US012685068B2

(12) United States Patent
Takamura et al.

(10) Patent No.: US 12,685,068 B2
(45) Date of Patent: Jul. 14, 2026

(54) SUBSTRATE PROCESSING METHOD AND SUBSTRATE PROCESSING APPARATUS

(71) Applicant: Tokyo Electron Limited, Tokyo (JP)

(72) Inventors: Yuya Takamura, Iwate (JP); Masami Oikawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 640 days.

(21) Appl. No.: 17/930,459

(22) Filed: Sep. 8, 2022

(65) Prior Publication Data

US 2023/0096299 A1     Mar. 30, 2023

(30) Foreign Application Priority Data

Sep. 29, 2021     (JP) ................................. 2021-159697

(51) Int. Cl.
| | |
|---|---|
| *C23C 16/00* | (2006.01) |
| *C23C 16/40* | (2006.01) |
| *H10P 72/00* | (2026.01) |
| *H10P 95/90* | (2026.01) |

(52) U.S. Cl.
CPC ........ *H10P 72/0434* (2026.01); *C23C 16/401* (2013.01); *H10P 95/90* (2026.01)

(58) Field of Classification Search
CPC .................................................... C23C 16/00
See application file for complete search history.

(56) References Cited

U.S. PATENT DOCUMENTS

2010/0105192 A1 *   4/2010   Akae ................. H01L 21/02263
                                                                438/758

FOREIGN PATENT DOCUMENTS

| JP | 2000-077621 | 3/2000 |
|---|---|---|
| JP | 2004-214305 | 7/2004 |
| JP | 2014-064041 | 4/2014 |

* cited by examiner

*Primary Examiner* — Gordon Baldwin
*Assistant Examiner* — Mohammad Mayy
(74) *Attorney, Agent, or Firm* — IPUSA, PLLC

(57) ABSTRACT

Disclosed is a substrate processing method for processing a substrate in a processing vessel. In the substrate processing method, the following steps (a) through (d) are performed together
(a) heating the substrate to a set processing temperature,
(b) supplying deuterium into the processing vessel,
(c) supplying oxygen into the processing vessel, and
(d) discharging the deuterium and the oxygen in the processing vessel so that a pressure inside the processing vessel becomes a set processing pressure.

7 Claims, 5 Drawing Sheets

FIG.5B

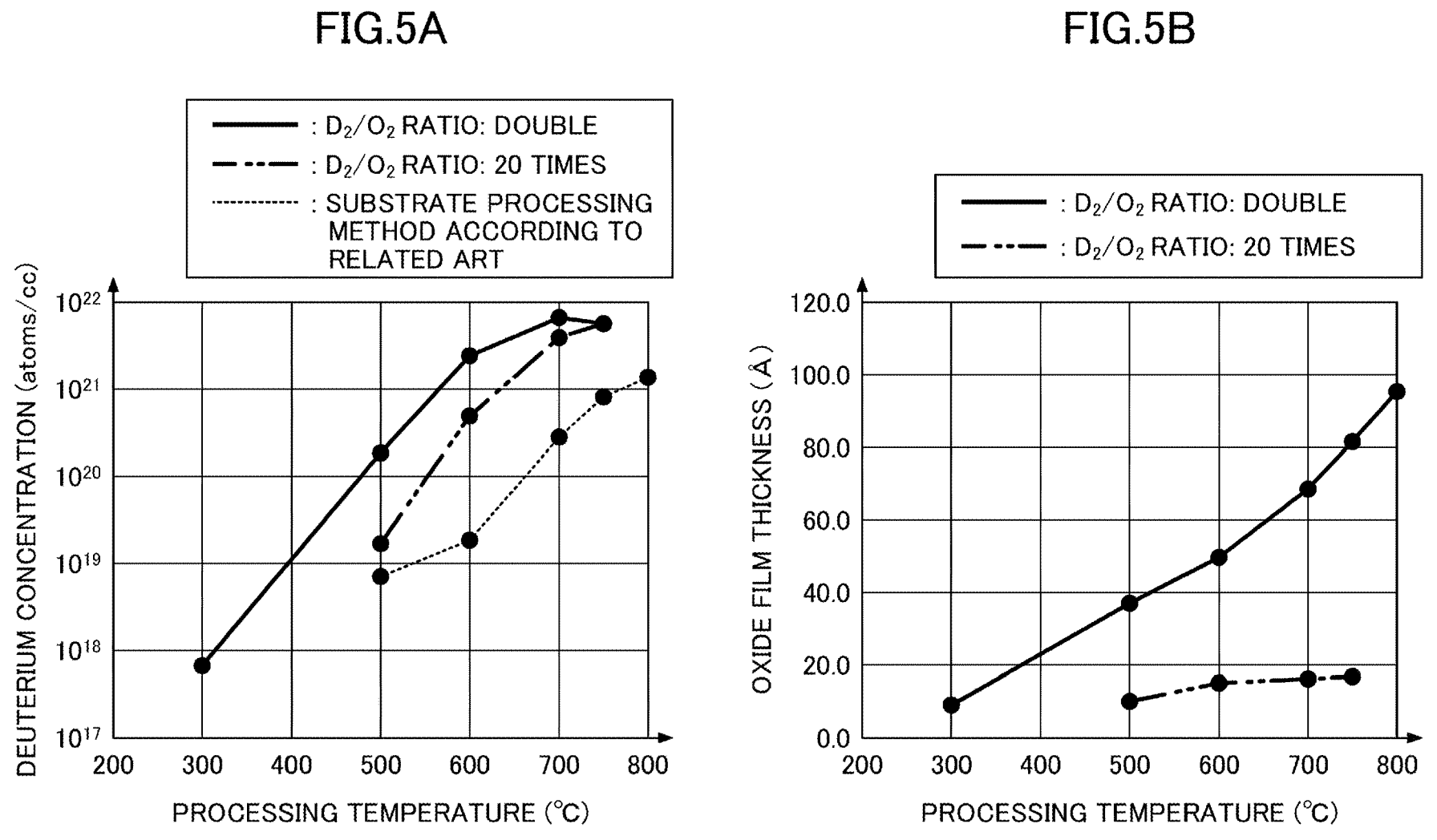

Legend:
- ———— : $D_2/O_2$ RATIO: DOUBLE
- —·—·— : $D_2/O_2$ RATIO: 20 TIMES

Y-axis: OXIDE FILM THICKNESS (Å)
X-axis: PROCESSING TEMPERATURE (°C)

FIG.5A

Legend:
- ———— : $D_2/O_2$ RATIO: DOUBLE
- —·—·— : $D_2/O_2$ RATIO: 20 TIMES
- ········ : SUBSTRATE PROCESSING METHOD ACCORDING TO RELATED ART Y-axis: DEUTERIUM CONCENTRATION (atoms/cc)
X-axis: PROCESSING TEMPERATURE (°C)

SUBSTRATE PROCESSING METHOD AND SUBSTRATE PROCESSING APPARATUS

CROSS-REFERENCE TO RELATED APPLICATIONS

This patent application is based on and claims priority to Japanese Patent Application No. 2021-159697, filed on Sep. 29, 2021, the entire contents of which are incorporated herein by reference.

TECHNICAL FIELD

The present disclosure relates to a substrate processing method and a substrate processing apparatus.

BACKGROUND

Patent Document 1 discloses a semiconductor memory device obtained by performing a deuterium anneal process in which a silicon film contains deuterium at a ratio greater than the ratio of deuterium to hydrogen found in nature. Deuterium-containing semiconductor memory devices have enhanced device characteristics (for example, the leak and hysteresis properties of the film).

RELATED ART DOCUMENT

Patent Document

[Patent Document 1] Japanese Patent Application Publication No. 2000-77621

SUMMARY

A substrate processing method for processing a substrate in a processing vessel, wherein, in the substrate processing method, the following steps (a) through (d) are performed together:

(a) heating the substrate to a set processing temperature;
(b) supplying deuterium into the processing vessel;
(c) supplying oxygen into the processing vessel; and
(d) discharging the deuterium and the oxygen in the processing vessel so that a pressure inside the processing vessel becomes a set processing pressure.

BRIEF DESCRIPTION OF THE DRAWINGS

FIG. 5A is a logarithmic graph illustrating the deuterium concentration of the wafer W with respect to the processing temperature when the anneal process is applied, as an example.

FIG. 5B is a graph illustrating a change in an oxide film thickness with respect to the processing temperature when the substrate processing method according to an embodiment is performed, as an example.

DETAILED DESCRIPTION OF EMBODIMENTS

Embodiments for implementing this disclosure are described below with reference to the drawings. In each drawing, the same component parts are given the same symbols, and duplicate descriptions may be omitted.

Figure 1:
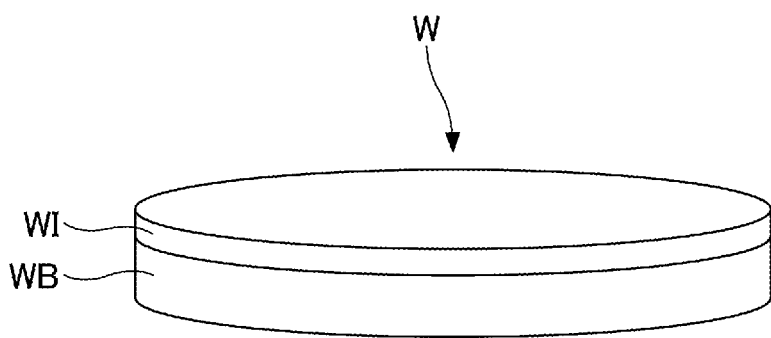
FIG. 1 is a diagram schematically illustrating a substrate to which a substrate processing method according to an embodiment is to be applied.

FIG. 1 is a diagram schematically illustrating a substrate to which a substrate processing method according to an embodiment is to be applied. As illustrated in FIG. 1, in the substrate processing method according to the embodiment, annealing (heat treatment) is performed on a wafer W, which is an example of a substrate. The wafer W to be processed is to be applied to a semiconductor memory, for example, and the wafer W to be processed includes a wafer body WB and an insulating film (underlayer) WI formed on the surface of the wafer body WB. In the wafer W, an amorphous silicon film or the like is to be formed on the insulating film WI.

A semiconductor substrate, such as that of silicon, can be used as the wafer body WB. In addition, the wafer body WB may be formed by first laminating multiple types of films. The insulating film WI has a function of insulating a gate in a semiconductor memory, for example. Examples of the insulating film WI include a silicon nitride film (SiN film) and a silicon oxide film ($SiO_2$ film). In a form in which the insulating film WI is laminated on the wafer body WB (in a state where annealing is to be performed), the insulating film WI may be flat or uneven.

In the substrate processing method, deuterium ($^2H$ or $D_2$) is incorporated into the insulating film WI of the wafer W during the annealing process. The device characteristics of the wafer W are greatly enhanced by the addition of deuterium to the insulating film WI. It should be noted that the target of deuterium incorporation is not limited to the insulating film WI, but may be various structures in which deuterium can enhance the device characteristics of the substrate.

Figure 2:
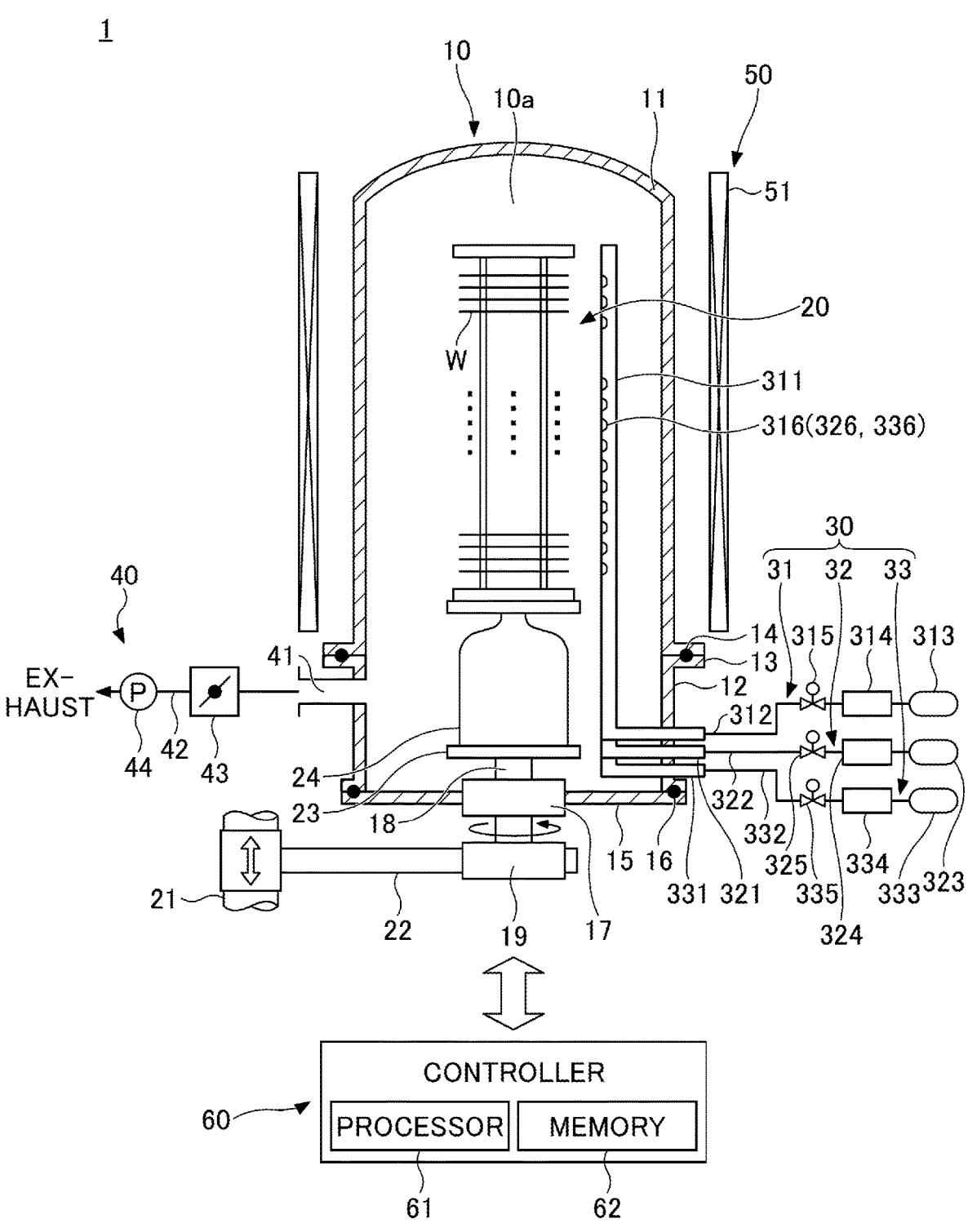
FIG. 2 is a schematic longitudinal sectional view illustrating a vertical heat treatment apparatus according to an embodiment.

FIG. 2 is a schematic longitudinal view illustrating a vertical heat treatment apparatus 1 according to an embodiment. As illustrated in FIG. 2, in the substrate processing method, annealing is performed by using the vertical heat treatment apparatus 1, which is a substrate processing apparatus. The vertical heat treatment apparatus 1 has a processing vessel 10, a wafer boat 20, a gas supply 30, a discharger 40, a heater 50, and a controller 60.

The processing vessel 10 of the vertical heat treatment apparatus 1 is formed in a cylindrical shape with a processing space 10a inside, and performs annealing while the wafer W is accommodated in the processing space 10a. The processing vessel 10 has a cylindrical body 11 including a cylindrical shape having a nearly hemispherical ceiling and an open lower end; a manifold 12 connected to the lower end of the cylindrical body 11; and a lid 15 connected to the lower end of the manifold 12.

The cylindrical body 11 is formed of a heat-resistant material, such as quartz. The cylindrical body 11 extends long in the vertical direction (longitudinal direction: height direction) and forms most of the processing space 10a of the processing vessel 10. In FIG. 2, the structure of the processing vessel 10 is depicted that includes one cylindrical body 11. However, the structure of the processing vessel 10 is not limited this example. For example, a multiple structure may be adopted for the processing vessel 10 in which multiple cylinders (an outer cylinder and an inner cylinder) are concentrically stacked.

The manifold 12 and lid 15 are formed of, for example, stainless steel. The manifold 12 has a flange 13 at the upper end, and the lower end of the cylindrical body 11 is supported by this flange 13. The lower end of the cylindrical body 11 and the flange 13 are hermetically connected through a sealing member 14, such as an O-ring. Similarly, the lower end of the manifold 12 and the lid 15 are hermetically contact through a sealing member 16, such as an O-ring.

At the center of the lid 15, a rotating shaft 18 is penetrated through a magnetic fluid seal 17. The rotating shaft 18 has a wafer boat 20 on the upper part and is connected to a rotary driver 19. By rotation of the rotary driver 19, the rotating shaft 18 rotates relative to the processing vessel 10. As a result, the wafer boat 20 rotates.

The lower part of the rotating shaft 18 is rotatably supported by an arm 22 of an elevator 21, such as a boat elevator. A rotating plate 23 is provided at the upper end of the rotating shaft 18, and a wafer boat 20 is mounted on the rotating plate 23 via a quartz heat retaining platform 24. Accordingly, the lid 15 and the wafer boat 20 are moved up and down integrally by raising and lowering the elevator 21 so that the wafer boat 20 can be accommodated in and detached from the inside of the cylindrical body 11.

The wafer boat 20 of the vertical heat treatment apparatus 1 is a substrate holder that extends vertically (in the height direction) in the processing vessel 10 and holds a plurality of wafers W at predetermined intervals along the vertical direction. Each wafer W is mounted on the wafer boat 20 in a state separated from the processing vessel 10 by lowering of the elevator 21. After placing each wafer W, the wafer boat 20 is inserted into the processing vessel 10 by raising the elevator 21.

The gas supply 30 of the vertical heat treatment apparatus 1 according to the present embodiment is configured so that multiple types of gases can be introduced into the processing space 10a. Specifically, in the annealing process, the gas supply 30 supplies deuterium gas to be taken into the insulating film WI, and also supplies oxygen gas and inert gas (For example, $N_2$ gas) together. Thus, the gas supply 30 is provided with a deuterium supply 31, an oxygen supply 32 and an inert gas supply 33.

The deuterium supply 31 is provided with a deuterium supply pipe 311 in the processing vessel 10 and a deuterium supply channel 312 outside the processing vessel 10. In the deuterium supply channel 312, a deuterium gas source 313, a mass flow controller 314, and a deuterium valve 315 are provided in order from upstream to downstream in the gas flow direction. As a result, the deuterium gas in the deuterium gas source 313 is supplied at a controlled timing by a deuterium valve 315 and at a predetermined flow rate by a mass flow controller 314. The deuterium gas flows from the deuterium supply channel 312 into the deuterium supply pipe 311, and the deuterium gas is discharged from the deuterium supply pipe 311 into the processing vessel 10.

Similarly, the oxygen supply 32 includes an oxygen supply pipe 321 in the processing vessel 10 and an oxygen supply channel 322 outside the processing vessel 10. In the oxygen supply channel 322, an oxygen gas source 323, a mass flow controller 324, and an oxygen valve 325 are provided in order from upstream to downstream in the gas flow direction. As a result, the oxygen gas in the oxygen gas source 323 is supplied at a controlled timing by the oxygen valve 325 and at a predetermined flow rate by the mass flow controller 324. Oxygen gas flows from the oxygen supply channel 322 into the oxygen supply pipe 321 and, and the oxygen gas is discharged from the oxygen supply pipe 321 into the processing vessel 10.

The inert gas supply 33 is provided with an inert gas supply pipe 331 in the processing vessel 10 and an inert gas supply channel 332 outside the processing vessel 10. The inert gas supply channel 332 is provided with an inert gas source 333, a mass flow controller 334, and an inert gas valve 335 in order from the upstream side to the downstream side in the gas flow direction. As a result, the inert gas in the inert gas source 333 is supplied at a controlled timing by the inert gas valve 335 and at a predetermined flow rate by the mass flow controller 334. The inert gas flows from the inert gas supply channel 332 into the inert gas supply pipe 331, and the inert gas is discharged from the inert gas supply pipe 331 into the processing vessel 10.

Each gas supply pipe (the deuterium supply pipe 311, the oxygen supply pipe 321, and the inert gas supply pipe 331) is formed of, for example, quartz and fixed to the cylindrical body 11 or manifold 12. Each gas supply pipe penetrates the manifold 12 by extending linearly along the vertical direction at a position in the vicinity of the cylindrical body 11 and by bending in an L-shape and extending in the horizontal direction in the manifold 12. The gas supply pipes are arranged side by side along the circumferential direction of the cylindrical body 11 and are formed at the same height with each other.

Multiple deuterium discharge ports 316 are provided at the portion of the deuterium supply pipe 311 located at the cylindrical body 11. Multiple oxygen discharge ports 326 are provided at the portion of the oxygen supply pipe 321 located at the cylindrical body 11. Multiple inert gas discharge ports 336 are provided at the portion of the inert gas supply pipe 331 located at the cylindrical body 11. Each discharge port (the deuterium discharge ports 316, the oxygen discharge ports 326, and the inert gas discharge ports 336) is formed at predetermined intervals along the extending direction of each gas supply pipe and discharges gas in the horizontal direction. The spacing between discharge ports is set to be the same as the spacing between wafers W held in the wafer boat 20, for example. The position of each discharge port in the height direction is set to an intermediate position between the wafers W adjacent in the vertical direction. As a result, each discharge port can efficiently supply gas to the opposing surfaces between adjacent wafers W.

The gas supply 30 may mix several types of gas and discharge the mixed gas from one supply pipe. Alternatively, gas supply pipes (the deuterium supply pipe 311, the oxygen supply pipe 321, and the inert gas supply pipe 331) may have different shapes or arrangements from each other, and, for example, the deuterium supply pipe 311 may be thicker than the oxygen supply pipe 321 in a configuration with a large supply of deuterium. Furthermore, the supply amount of the inert gas with respect to the supply amount of the deuterium gas and the supply amount of the oxygen gas may be significantly smaller, and the vertical heat treatment apparatus 1 may be configured not to supply inert gas. The vertical heat treatment apparatus 1 may be configured to supply another gas in addition to the deuterium gas, the oxygen gas, and the inert gas.

The discharger 40 is provided in a gas outlet 41 formed in the upper side wall of the manifold 12. The discharger 40 has an exhaust path 42 connected to the gas outlet 41, and the exhaust path 42 is provided with a pressure regulating valve 43 and a pump 44 in order from the upstream side to the downstream side in the gas flow direction. The discharger 40 operates the pressure regulating valve 43 and the pump 44 based on the control of the controller 60, and the discharger 40 adjusts the pressure in the processing vessel 10 by using the pressure regulating valve 43 while suctioning the gas in the processing vessel 10 by using the pump 44.

The cylindrical heater 50 includes a cylindrical heater 51 surrounding the cylindrical body 11 on the outside of the cylindrical body 11 in the radial direction. The heater 51 heats the wafers W accommodated in the processing vessel 10 by heating the entire side circumference of the processing vessel 10.

For the controller 60 of the vertical heat treatment apparatus 1, a computer may be adopted that has one or more processors 61, a memory 62, input/output interfaces, and electronic circuits. The input/output interfaces and the electronic circuits are not depicted. The processor 61 may be a combination of one or more of the following: a central processing unit (CPU), an application-specific integrated circuit (ASIC), a field programmable gate array (FPGA), a circuit formed of multiple discrete semiconductors, and the like. The memory 62 includes a volatile memory and a nonvolatile memory (for example, a compact disc, a digital versatile disc (DVD), a hard disk, or a flash memory), and the memory 62 stores recipes, such as a program for operating the vertical heat treatment apparatus 1 and process conditions for annealing.

By executing a program and a recipe stored in the memory 62, the processor 61 controls each component of the vertical heat treatment apparatus 1 to implement the substrate processing method. In the substrate processing method according to an embodiment, the processor 61 controls the operation of each component so that at least the following processes (a) through (d) are performed together (simultaneously):

(a) heating the processing vessel 10 to a set processing temperature;

(b) supplying deuterium into the processing vessel 10;

(c) supplying oxygen into the processing vessel 10; and (d) discharging the deuterium and the oxygen in the processing vessel 10 to adjust the pressure inside the processing vessel 10 to a set pressure.

Specifically, in the heating of (a), the processor 61 controls the operation of the cylindrical heater 51 in the heater 50 to heat the processing vessel 10, and the processor 61 adjusts the temperature of the wafer W accommodated in the processing vessel 10. By performing the supply of deuterium of (b) and the supply of oxygen (c) together (simultaneously), the vertical heat treatment apparatus 1 can process the wafer W at a temperature that is lower than that of the method according to related art in which annealing is performed by only supplying deuterium gas (which is referred to as the substrate processing method according to the related art, hereinafter). For example, the processing temperature of the wafer W in the substrate processing method according to the related art is set to approximately 800° C. In contrast, the range of the processing temperature in the heating of (a) can be set to the range approximately from 500° C. to 700° C.

In the substrate processing method, the deuterium gas and the oxygen gas are introduced into the wafer W in the processing vessel 10 by performing the supply of deuterium of (b) and the supply of oxygen of (c). The deuterium gas flows in the processing space 10*a* and undergoes a radical reaction with the insulating film WI of the wafer W being heated by the heating process. The oxygen gas activates the radical reaction of deuterium by being mixed with the deuterium gas in the processing space 10*a*. As a result, deuterium is smoothly incorporated (added) into the insulating film WI of the wafer W, and the deuterium concentration of the insulating film WI of the wafer W increases.

In the deuterium supply process and the oxygen supply process, the processor 61 can adjust the concentration of deuterium taken into the insulating film WI of the wafer W by appropriately controlling the flow rate of deuterium gas and the flow rate of oxygen gas. For example, the ratio of the flow rate of deuterium gas to the flow rate of oxygen gas (which is referred to as the $D_2/O_2$ ratio, hereinafter) is preferably set in the range of twice to 20 times (see the examples below). When the $D_2/O_2$ ratio is less than twice, the oxide film thickness of the insulating film WI increases due to the increase in the oxygen concentration in the processing vessel 10. In contrast, when the $D_2/O_2$ ratio is greater than 20 times, the incorporated amount of deuterium into the insulating film WI is reduced because the oxygen concentration in the processing vessel 10 is low.

In addition, in the discharge process of (d), the processor 61 adjust the pressure in the processing vessel 10 by operating the pump 44 in the discharger 40 to suction the gas in the processing vessel 10 and by controlling the opening degree of the pressure regulating valve 43. The pressure in the processing vessel 10 is preferably set to be less than or equal to 1 Torr (=133.32 Pa), for example, and in this embodiment, the pressure in the processing vessel 10 is set to 0.35 Torr (=46.66 Pa). In the substrate processing method according to the related art, the pressure in the processing vessel 10 is set to approximately 90 Torr (=11999 Pa).

Namely, the vertical heat treatment apparatus 1 can lower annealing temperature and increase concentration of deuterium incorporated into the wafer W by performing the above processes (a) to (d) together (or simultaneously).

The vertical heat treatment apparatus 1 according to the embodiment is basically constructed as described above, and the operation and the advantageous effect of the substrate processing method are described below.

After starting operation in accordance with activation, such as turning on the power supply, the processor 61 of the vertical heat treatment apparatus 1 executes the program stored in the memory 62 to perform the substrate processing method. For example, as a pre-processing of the substrate processing method, the processor 61 operates the elevator 21 to accommodate the wafer boat 20 on which the multiple wafers W are mounted in the processing vessel 10. By contacting the lid 15 lifted by the elevator 21 with the manifold 12, the processing vessel 10 is hermetically sealed.

Figure 3:
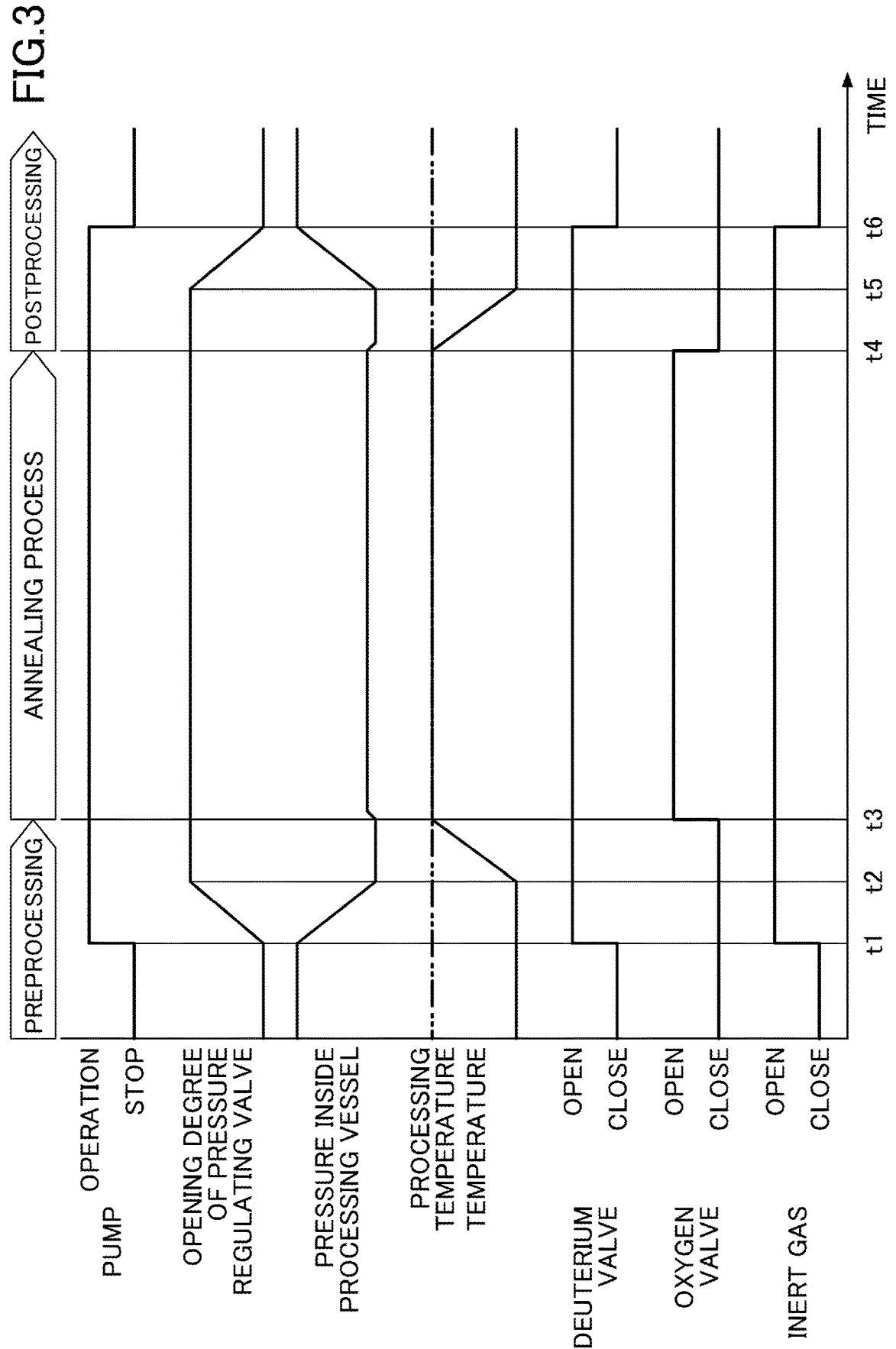
FIG. 3 is a timing chart illustrating an example of a substrate processing method executed by the vertical heat treatment apparatus.

Subsequently, the processor 61 starts the above-described processes (a) to (d) in the substrate processing method at appropriate timing. FIG. 3 is a timing chart illustrating an example of a substrate processing method performed by the vertical heat treatment apparatus 1. As illustrated in FIG. 3, the substrate treatment method reduces the pressure in the processing vessel 10 by using the discharger 40 and heats the processing vessel 10 by using the heater 50 in the pre-processing.

Specifically, the processor 61 starts the discharging process of (d) at a time point t1, suctioning the processing vessel 10 by using the pump 44 and gradually opening the pressure regulating valve 43 from an opening degree of 0%. Furthermore, at the time point t1, the processor 61 opens the deuterium valve 315 and starts the deuterium supply process of (b) in which deuterium gas is supplied from the deuterium gas source 313 into the processing vessel 10 via the deuterium supply channel 312 and the deuterium supply pipe 311. The processor 61 also opens the inert gas valve 335 in accordance with the supply of deuterium gas, and supplies the inert gas into the processing vessel 10 from the inert gas source 333 via the inert gas supply channel 332 and the inert gas supply pipe 331.

Accordingly, the vertical heat treatment apparatus 1 introduces deuterium gas and inert gas into the processing vessel 10 at the same time as the exhaust of gas from the processing vessel 10. In this case, the exhaust amount of the gas from the processing vessel 10 is larger than the flow rates of the deuterium gas and the inert gas supplied to the processing vessel 10. In addition, the flow rate of the inert gas is sufficiently small compared to that of the deuterium gas. Accordingly, the gas in the processing space 10a is replaced with the deuterium gas while the pressure in the processing vessel 10 is gradually reduced. For example, at a time point t2 after the time point t1, the pressure in the processing vessel 10 becomes constant at the pressure corresponding to the opening degree of the pressure regulating valve 43.

At a time point t2 during the pre-processing, the processor 61 operates the cylindrical heater 51 of the heater 50 to start the heating process of (a) for heating the processing vessel 10. With the heating of the cylindrical heater 51, the temperature inside the processing vessel 10 is also gradually raised to reach the processing temperature (for example, 600° C.) for annealing.

The processor 61 starts the annealing process at a time point t3 at which the temperature in the processing vessel 10 reaches the processing temperature. Additionally, at the time t3, the processor 61 opens the oxygen valve 325 and starts the oxygen supply process of (c) for supplying oxygen gas from the oxygen gas source 323 into the processing vessel 10 through the oxygen supply channel 322 and the oxygen supply pipe 321. As a result, the pressure in the processing vessel 10 becomes constant with a slight increase (for example, 0.35 Torr), and the substrate processing method performs the annealing process while maintaining this processing pressure.

In the annealing process, the vertical heat treatment apparatus 1 maintains a constant processing temperature in the processing vessel 10, and maintains a constant processing pressure in the processing vessel 10 by exhausting the gas in the processing vessel 10 while supplying the deuterium gas and the oxygen gas into the processing vessel 10. Namely, the substrate processing method performs the steps (a) through (d) together in the annealing process. As a result, the deuterium gas supplied into the processing vessel 10 is promoted to undergo a radical reaction by the oxygen gas, and a large amount the deuterium gas is incorporated into the insulating film WI. The duration of the annealing process is not particularly limited, but the duration of the annealing process may be approximately 30 minutes to 120 minutes. In addition, the processor 61 may operate the rotary driver 19 to rotate the wafer boat 20 in the annealing process. As a result, deuterium incorporated into the wafer W can be made more uniform in the plane direction. The rotation of the wafer boat 20 may be performed from the pre-processing.

In the substrate processing method, after performing the annealing process over a predetermined execution period, the annealing process is completed and the process proceeds to post-processing. For example, at the start of the post-processing at a time point t4, the processor 61 stops heating by the heater 50 (the cylindrical heater 51) and stops the supply of oxygen gas into the processing vessel 10 by closing the oxygen valve 325. As a result, the temperature of the processing vessel 10 gradually decreases and the pressure in the processing vessel 10 slightly decreases.

Subsequently, at a time point t5 at which the temperature of the processing vessel 10 decreases, the processor 61 decreases the opening degree of the pressure regulating valve 43. At the time point t5, the pressure in the processing vessel 10 increases because the supply of deuterium gas and inert gas continues. Subsequently, at a time point t6, the processor 61 stops the supply of deuterium gas and inert gas by closing the deuterium valve 315 and closing the inert gas valve 335. This completes the post-processing, and the processor 61 terminates the substrate processing method.

The substrate processing method is not limited to the above-described operation, and various modifications can be made. For example, in the above-described embodiment, the deuterium gas was supplied first in the pre-processing and the oxygen gas was supplied in the subsequent annealing process, but oxygen gas may be supplied first in the pre-processing and the deuterium gas may be supplied in the subsequent annealing process. In other words, as long as the gas can be replaced while the pressure in the processing vessel 10 is reduced to a predetermined pressure in the pre-processing, the same advantageous effect can be obtained in the annealing process using deuterium gas and oxygen gas regardless of which gas is supplied first. In the substrate processing method, deuterium gas and oxygen gas may be simultaneously supplied into the processing vessel 10.

Example

Figure 4:
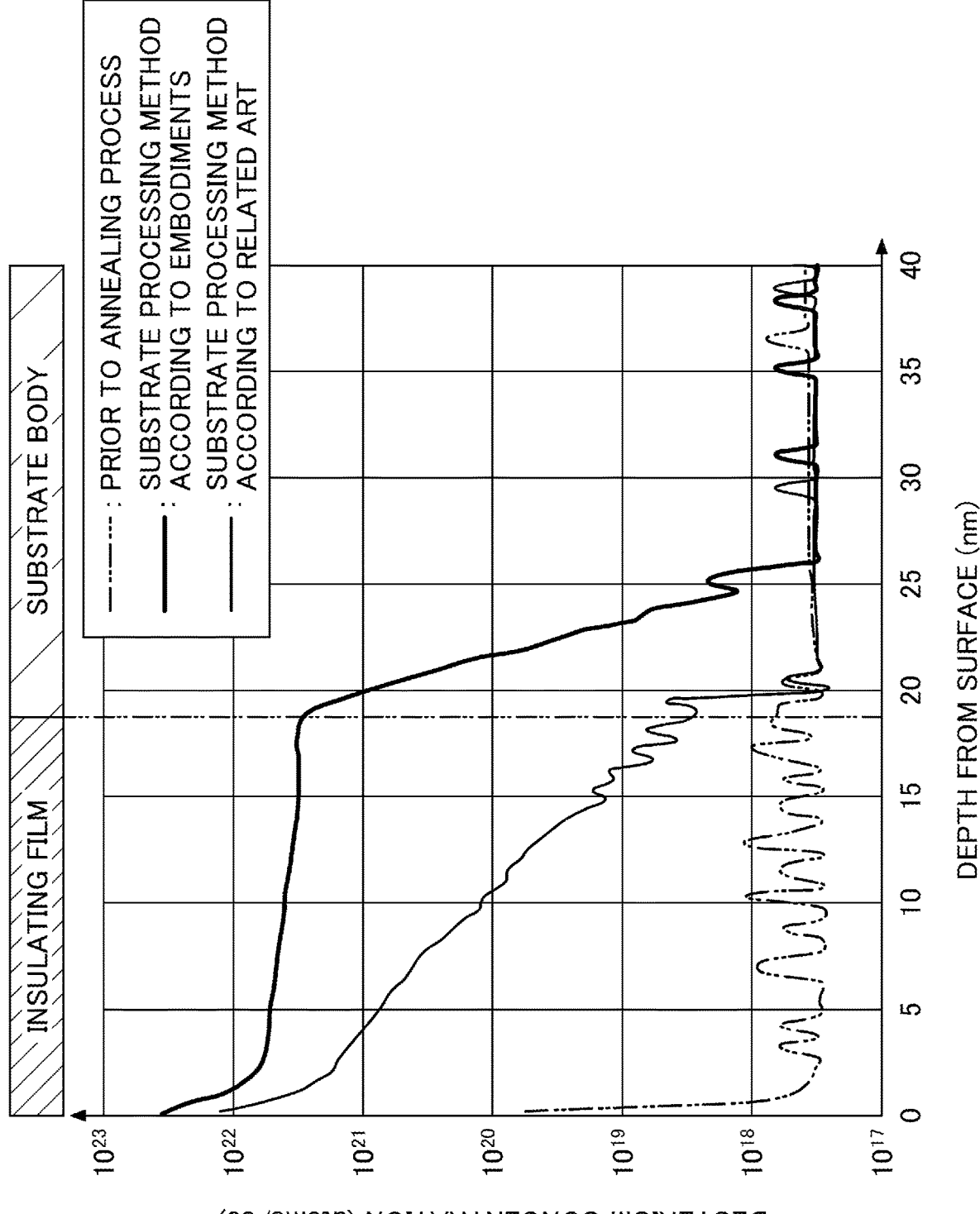
FIG. 4 is a logarithmic graph illustrating deuterium concentration of a wafer W to which an anneal process is applied, as an example.

FIG. 4 is a logarithmic graph illustrating the deuterium concentration of the wafer W upon performing an annealing process as an example. In FIG. 4, the horizontal axis represents the depth from the surface of the wafer W (insulating film WI) and the vertical axis represents the deuterium concentration. The thick line indicates the deuterium concentration along the depth direction of the wafer W in a case where the substrate processing method according to the embodiment is performed. The thin line indicates the deuterium concentration along the depth direction of the wafer W in a case where the substrate processing method according to the related art is applied.

As illustrated in FIG. 4, the insulating film WI of the wafer W has a thickness of approximately 18 nm from the surface. The deuterium concentration of the insulating film WI is below $10^{18}$ [atoms/cc] before the execution of the annealing process, which is similar to the deuterium concentration in nature. After the annealing process is performed, it can be seen that the deuterium concentration increases due to the incorporation of deuterium into the insulating film WI.

If the depth from the surface of the wafer W is the same, the deuterium concentration achieved by the substrate processing method according to the present embodiment is larger than the deuterium concentration achieved by the substrate processing method according to the related art, at any depth. In other words, it can be said that in the substrate processing method, more deuterium is incorporated into the insulating film WI by supplying deuterium gas and oxygen gas together during the annealing process. In the example, the processing pressure in the processing vessel 10 in the substrate processing method according to the present embodiment is 0.35 [Torr], while the processing pressure in the processing vessel in the substrate processing method according to the related art is 90 [Torr]. Other process conditions (the execution period, the temperature, and the like) are the same. Accordingly, if the annealing process is performed at the same processing pressure, it can be said that the substrate processing method according to the embodiment generates a large difference in the deuterium concentration compared to the deuterium concentration achieved by the substrate processing method according to the related art.

FIG. 5A is a logarithmic graph illustrating the deuterium concentration of the wafer W with respect to the processing temperature in a case where the annealing process is performed as an example. In FIG. 5A, the horizontal axis represents the processing temperature and the vertical axis represents the deuterium concentration of the insulating film WI. In the example, the change in deuterium concentration with respect to the change in processing temperature in the substrate processing method according to the related art is indicated by the dotted line. In addition, the change of the deuterium concentration with respect to the change in the processing temperature in a case where the $D_2/O_2$ ratio is twice is indicated by a thick line, and the change of the deuterium concentration with respect to the change in the processing temperature in a case where the $D_2/O_2$ ratio is 20 times is indicated by a thick two-dot chain line.

As illustrated in FIG. 5A, in the case of the substrate processing method according to the related art, the deuterium concentration exceeds $10^{20}$ [atoms/cc] at a processing temperature higher than or equal to 700° C., and the deuterium concentration exceeds $10^{21}$ [atoms/cc] at a processing temperature higher than or equal to 800° C. In contrast, in the case where the $D_2/O_2$ ratio is twice, the deuterium concentration exceeds $10^{20}$ [atoms/cc] at a processing temperature higher than or equal to 600° C., and the deuterium concentration exceeds $10^{21}$ [atoms/cc] at a processing temperature higher than or equal to 600° C. In the case where the $D_2/O_2$ ratio is 20 times, the deuterium concentration exceeds $10^{20}$ [atoms/cc] at a processing temperature higher than or equal to 600° C., and the deuterium concentration exceeds $10^{21}$ [atoms/cc] at a processing temperature higher than or equal to 700° C. Accordingly, at the same processing temperature, it can be said that the deuterium concentration increases if deuterium gas and oxygen gas are supplied together. Conversely, according to the substrate processing method in which deuterium gas and oxygen gas are supplied together, the processing temperature can be set to a low temperature.

In addition, the deuterium concentration in the case where the $D_2/O_2$ ratio is twice is slightly higher than the deuterium concentration in the case where the $D_2/O_2$ ratio is 20 times. This indicates that the deuterium concentration tends to increase with a larger supply of oxygen gas.

FIG. 5B is a graph illustrating the change in the oxide film thickness with respect to the processing temperature in a case where the substrate processing method according to the embodiment is performed as an example. In FIG. 5B, the horizontal axis represents the processing temperature and the vertical axis represents the oxide film thickness.

As illustrated in FIG. 5B, in the case where the $D_2/O_2$ ratio is twice, the oxide film thickness increases, and in the case where the $D_2/O_2$ ratio is 20 times, the increase in the oxide film thickness is suppressed. Accordingly, in the implementation of the substrate processing method, if the increase in the thickness of the oxide film is to be suppressed, it suffices if the flow rate of oxygen gas is reduced relative to the flow rate of deuterium gas. Accordingly, the balance between the deuterium concentration and the oxide film thickness can be optimized by supplying deuterium gas and oxygen gas at an appropriate $D_2/O_2$ ratio according to the wafer W to be processed. For example, in a case where there is no problem with the formation of an oxide film, the $D_2/O_2$ ratio can be set to approximately from twice to 5 times, while setting the processing temperature to a low temperature (e.g., a temperature in a range approximately from 500° C. to 600° C.). In the case where the formation the oxide film is to be suppressed, the $D_2/O_2$ ratio can be set to approximately from 15 times to 20 times, while setting the processing temperature to a high temperature (e.g., a temperature in a range approximately from 600° C. to 700° C.).

The technical ideas and advantageous effects of the disclosure described in the above embodiments are described below.

According to a first aspect of the present disclosure, there is provided a substrate processing method for processing a substrate (wafer W) in a processing vessel 10, in which the following steps (a) through (d) are performed together:

(a) heating the substrate to a set processing temperature;

(b) supplying deuterium into the processing vessel 10;

(c) supplying oxygen into the processing vessel 10; and (d) discharging the deuterium and the oxygen in the processing vessel 10 so that a pressure inside the processing vessel becomes a set processing pressure.

According to the above-described substrate processing method, by supplying deuterium and oxygen into the processing vessel 10 during the heating of the processing vessel 10, a larger amount of deuterium can be incorporated into the substrate (wafer W) compared to a case where only deuterium is supplied to the processing vessel 10, and, thus, the deuterium concentration of the substrate can further be increased. As a result, the device characteristics of the substrate can further be enhanced. For example, if the substrate is a semiconductor memory, a film with a high concentration of deuterium can greatly enhance device reliability.

Furthermore, at the start of the processing of the substrate (wafer W), one of the step (b) or the step (c) may be started first, and the other of the step (b) or the step (c) may be started after the pressure inside the processing vessel 10 becomes processing pressure. As a result, in the substrate treatment method, the annealing process with deuterium and oxygen can be performed in a state in which the processing pressure in the processing vessel 10 is stabilized, and the distribution of deuterium incorporated into the substrate can be made uniform.

The timing to start the other of the step (b) or the step (c) may be a timing at which the processing temperature is reached by heating the substrate (wafer W) in the step (a). As a result, in the substrate processing method, the annealing process with deuterium and oxygen can be performed in a state in which the processing temperature is increased, so that the waste of deuterium and oxygen can be reduced.

Furthermore, in the step (a), the processing temperature may be set to a temperature in a range from 500° C. to 700° C. As a result, in the substrate processing method, the annealing process can be performed at a processing temperature that is lower than the processing temperature in the annealing process according to related art, so that energy saving during the processing can be facilitated and damage to the substrate (wafer W) can be suppressed.

Furthermore, in the step (d), the processing pressure may be set to lower than or equal to 1 Torr. As a result, in the substrate processing method, the substrate (wafer W) can be processed under a low-pressure environment in the processing vessel 10, and the supply of deuterium and oxygen can be reduced as much as possible.

A radio of a flow rate of the deuterium flowed in step (b) to the flow rate of the oxygen supplied in step (c) may be in a range from twice to 20 times. As a result, the substrate processing method can stably cause deuterium to be incorporated into the substrate (wafer W).

Furthermore, the substrate (wafer W) may include an insulating film WI formed on a surface of the substrate, and the deuterium may be incorporated into the insulating film WI by the processing of the substrate. As a result, the substrate may include an insulating film WI including a large amount of deuterium, so that the leak characteristics and the hysteresis characteristics of the insulating film WI can be greatly enhanced.

According to a second aspect of the present disclosure, there is provided a substrate processing apparatus (the vertical heat treatment apparatus 1) that processes a substrate (wafer W), the substrate processing apparatus including a processing vessel 10 that accommodates the substrate therein, a heater 50 that heats the substrate, a deuterium supply 31 that supplies deuterium into the processing vessel 10, an oxygen supply 32 that supplies oxygen into the processing vessel 10, a discharger 40 that discharges deuterium and oxygen in the processing vessel 10, and a controller 60 that controls the heater 50, the deuterium supply 31, the oxygen supply 32, and the discharger 40, wherein the controller 60 performs the following steps (a) through (d) together:

(a) heating the processing vessel 10 to a set processing temperature;

(b) supplying deuterium into the processing vessel 10;

(c) supplying oxygen into the processing vessel 10; and (d) discharging deuterium and oxygen in the processing vessel 10 so that the pressure inside the processing vessel 10 becomes a processing pressure.

As a result, the substrate processing apparatus (the vertical heat treatment apparatus 1) can further increase the deuterium concentration in the substrate (wafer W).

Furthermore, in the processing vessel 10, a plurality of substrates (wafers W) may be capable of being arranged along a predetermined direction, wherein the deuterium supply 31 may include a deuterium supply pipe 311 extending along the arrangement direction of the plurality of substrates in the processing vessel 10, wherein the deuterium supply pipe 311 may include a plurality of deuterium discharge ports 316 to discharge the deuterium along the arrangement direction, wherein the oxygen supply 32 may include an oxygen supply pipe 321 adjacent to the deuterium supply pipe 311 in the processing vessel 10 and extending along the arrangement direction of the plurality of substrates, and wherein the oxygen supply pipe 321 may include a plurality of oxygen discharge ports 326 to discharge the oxygen along the extending direction. Accordingly, the substrate processing apparatus (the vertical heat treatment apparatus 1) can process multiple substrates at once and can favorably cause deuterium to be incorporated into the substrate.

The substrate processing method and substrate processing apparatus in the disclosed embodiments are illustrative in all respects and are not restrictive. The embodiments can be modified and enhanced in various forms without departing from the scope and gist of the attached claims. The matters described in the above-described embodiments can be replaced with other configurations, as long as there is no contradiction, and can be combined, as long as there is no contradiction. As a substrate processing apparatus according to the embodiment, the vertical heat treatment apparatus 1 that performs the substrate processing method by arranging the substrates in the vertical direction is exemplified, but the substrate processing apparatus is not limited to this. For example, as a substrate processing device, a device that performs a substrate processing method by arranging multiple substrates horizontally may be applied, or a device that performs a substrate processing method for a single substrate may be applied.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method for processing a substrate in a processing vessel, comprising:

(a) heating the substrate to a set processing temperature;

(b) supplying deuterium into the processing vessel;

(c) supplying oxygen into the processing vessel; and (d) discharging the deuterium and the oxygen in the processing vessel so that a pressure inside the processing vessel maintains a set processing pressure, wherein, at a start of the processing of the substrate, the step (b) is started first so that the pressure inside the processing vessel becomes stable at a pressure that corresponds to opening degree of a pressure regulating valve of the processing vessel, wherein the step (a) is started after the pressure inside the processing vessel becomes stable by step (b) at the pressure that corresponds to opening degree of the pressure regulating valve of the processing vessel, wherein the step (c) is started, after the step (b) is started, when the pressure inside the processing vessel becomes stable at the pressure that corresponds to opening degree of a pressure regulating valve of the processing vessel, and wherein the step (d) is performed after the step (c) is started, and the step (b) and the step (c) are continuingly performed while the step (d) is performed.

2. The substrate processing method according to claim 1, wherein a timing to start the step (c) is timing at which the processing temperature is reached by heating the substrate in the step (a).

3. The substrate processing method according to claim 1, wherein, in the step (a), the processing temperature is set to a temperature in a range from 500° C. to 700° C.

4. The substrate processing method according to claim 1, wherein, in the step (d), the processing pressure is set to lower than or equal to 1 Torr.

5. The substrate processing method according to claim 1, wherein a ratio of a flow rate of the deuterium flowed in the step (b) to a flow rate of the oxygen supplied in the step (c) is in a range from twice to 20 times.

6. The substrate processing method according to claim 1, wherein the substrate includes an insulating film formed on a surface of the substrate, and the deuterium is incorporated into the insulating film by the processing of the substrate.

7. The substrate processing method according to claim 1, wherein the substrate includes an insulating film comprising silicon nitride or a high-k dielectric, and the method includes incorporating the deuterium into the insulating film and reducing a leakage current of the insulating film.

* * * * *